United States Patent
Chen et al.

(10) Patent No.: US 8,530,969 B2
(45) Date of Patent: Sep. 10, 2013

(54) SEMICONDUCTOR DEVICE

(75) Inventors: Lu-An Chen, Keelung (TW);
Tai-Hsiang Lai, Hsinchu (TW);
Tien-Hao Tang, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 13/369,423

(22) Filed: Feb. 9, 2012

(65) Prior Publication Data

US 2013/0207184 A1     Aug. 15, 2013

(51) Int. Cl.
*H01L 23/62* (2006.01)
(52) U.S. Cl.
USPC ........... 257/356; 257/355; 257/360; 257/339; 257/343; 257/409; 257/E29.256
(58) Field of Classification Search
USPC ........................................................ 257/339
See application file for complete search history.

(56) References Cited

U.S. PATENT DOCUMENTS

| | | | |
|---|---|---|---|
| 5,637,900 A | 6/1997 | Ker et al. | |
| 5,903,032 A * | 5/1999 | Duvvury | 257/356 |
| 5,959,820 A | 9/1999 | Ker et al. | |
| 6,144,070 A * | 11/2000 | Devore et al. | 257/343 |
| 6,724,677 B1 | 4/2004 | Su et al. | |
| 6,909,149 B2 | 6/2005 | Russ et al. | |
| 6,979,864 B2 * | 12/2005 | Negoro et al. | 257/335 |
| 7,009,252 B2 | 3/2006 | Lin et al. | |
| 7,027,276 B2 | 4/2006 | Chen | |
| 7,180,133 B1 * | 2/2007 | Vashchenko et al. | 257/343 |
| 7,205,612 B2 | 4/2007 | Cai et al. | |
| 7,368,761 B1 * | 5/2008 | Lai et al. | 257/173 |
| 7,655,980 B1 | 2/2010 | Chao et al. | |
| 7,672,100 B2 | 3/2010 | Van Camp | |
| 2003/0076636 A1 | 4/2003 | Ker et al. | |
| 2006/0267102 A1 | 11/2006 | Cheng et al. | |
| 2010/0102379 A1 * | 4/2010 | Wang et al. | 257/328 |
| 2012/0126323 A1 * | 5/2012 | Wu et al. | 257/343 |

* cited by examiner

*Primary Examiner* — Julio J Maldonado
*Assistant Examiner* — Molly Reida
(74) *Attorney, Agent, or Firm* — WPAT, PC; Justin King

(57) ABSTRACT

A semiconductor device includes a substrate, a gate structure, a source structure and a drain structure. The substrate includes a deep well region, and the gate structure is disposed on the deep well region. The source structure is formed within the deep well and located at a first side of the gate structure. The drain structure is formed within the deep well region and located at a second side of the gate structure. The drain structure includes a first doped region of a first conductivity type, a first electrode and a second doped region of a second conductivity type. The first doped region is located in the deep well region; the first electrode is electrically connected to the first doped region. The second doped region is disposed within the first doped region and between the first electrode and the gate structure.

9 Claims, 6 Drawing Sheets

SEMICONDUCTOR DEVICE

FIELD OF THE INVENTION

The present invention relates generally to a semiconductor device, and more particularly to a semiconductor device in integrated circuits for improving ESD protecting ability.

BACKGROUND OF THE INVENTION

Electrostatic discharge (ESD) may occur during packaging, testing, and transporting of integrated circuits (ICs) due to the electrostatic charge accumulated on human body or instruments, lead to unrecoverable damage to semiconductor elements in ICs, and affect the functionality of ICs.

Therefore, to avoid the damage caused by ESD, ESD protecting circuits are required in ICs. Generally, an ESD protecting circuit includes at least one high voltage semiconductor device, such as lateral diffused N type metal oxide semiconductor transistor (LDNMOS). The maximum withstanding voltage is the most important concern of high voltage semiconductor devices. As the dimensional size of semiconductor devices is becoming smaller and smaller, it is more and more difficult to improve the maximum withstanding voltage.

SUMMARY OF THE INVENTION

In one embodiment, a semiconductor device is provided. The semiconductor device has improved ESD protecting ability. The semiconductor device includes a substrate, a gate structure, a source structure and a drain structure. The substrate includes a deep well region, and the gate structure is disposed on the deep well region. The source structure is formed within the deep well and located at a first side of the gate structure. The drain structure is formed within the deep well region and located at a second side of the gate structure. The drain structure includes a first doped region of a first conductivity type, a first electrode and a second doped region of a second conductivity type. The first doped region is located in the deep well region; the first electrode is electrically connected to the first doped region. The second doped region is disposed within the first doped region and between the first electrode and the gate structure.

In the above semiconductor device, the drain structure includes the first doped region of the first conductivity type, and the second doped region within the first doped region of the second conductivity type, the maximum withstanding voltage of the semiconductor device is improved. Also, the ESD protecting ability is enhanced.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
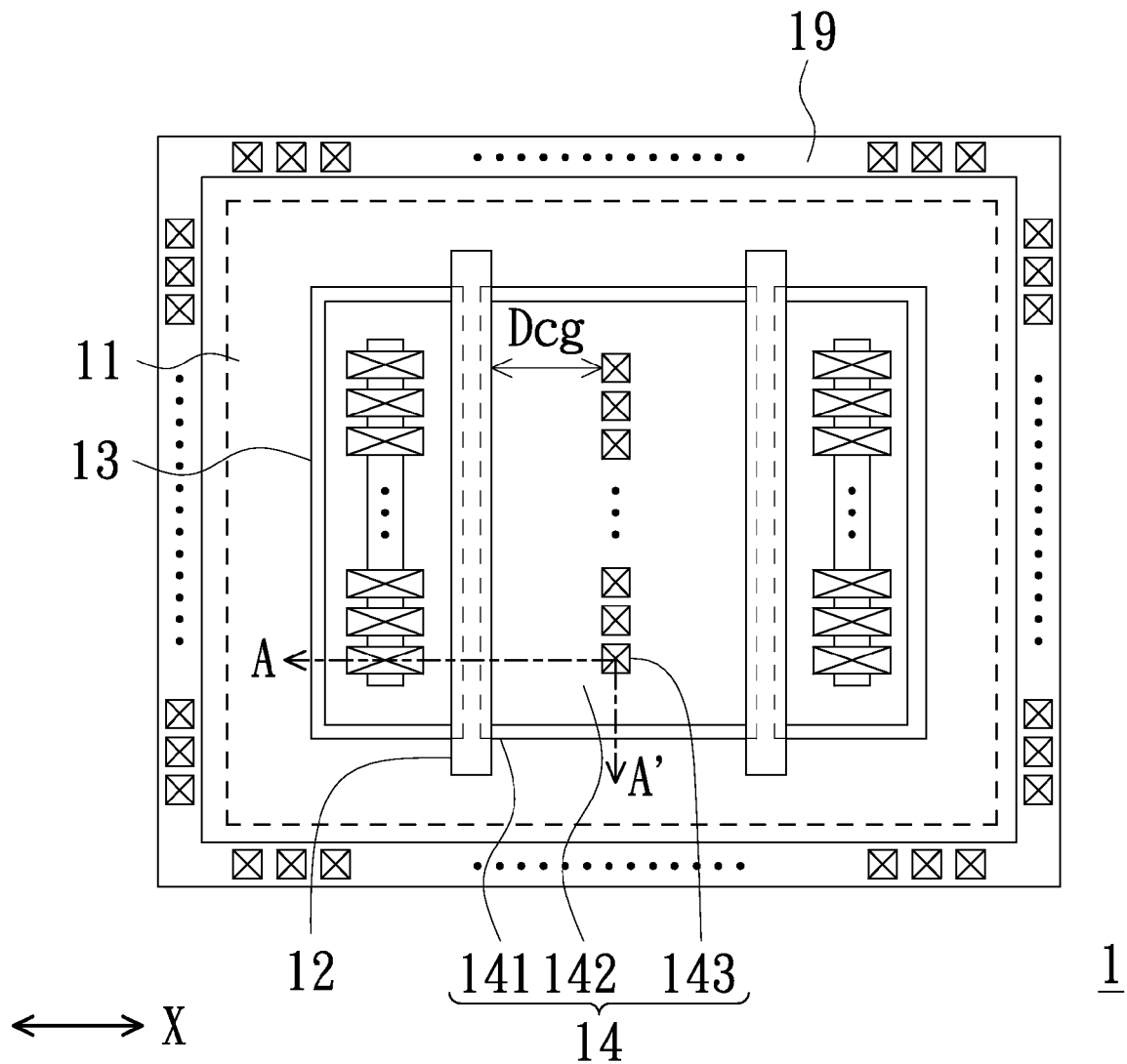
FIG. 1 is a schematic top view showing a lateral diffused N type metal oxide semiconductor device (LDNMOS) for an ESD protecting circuit.
Figure 2:
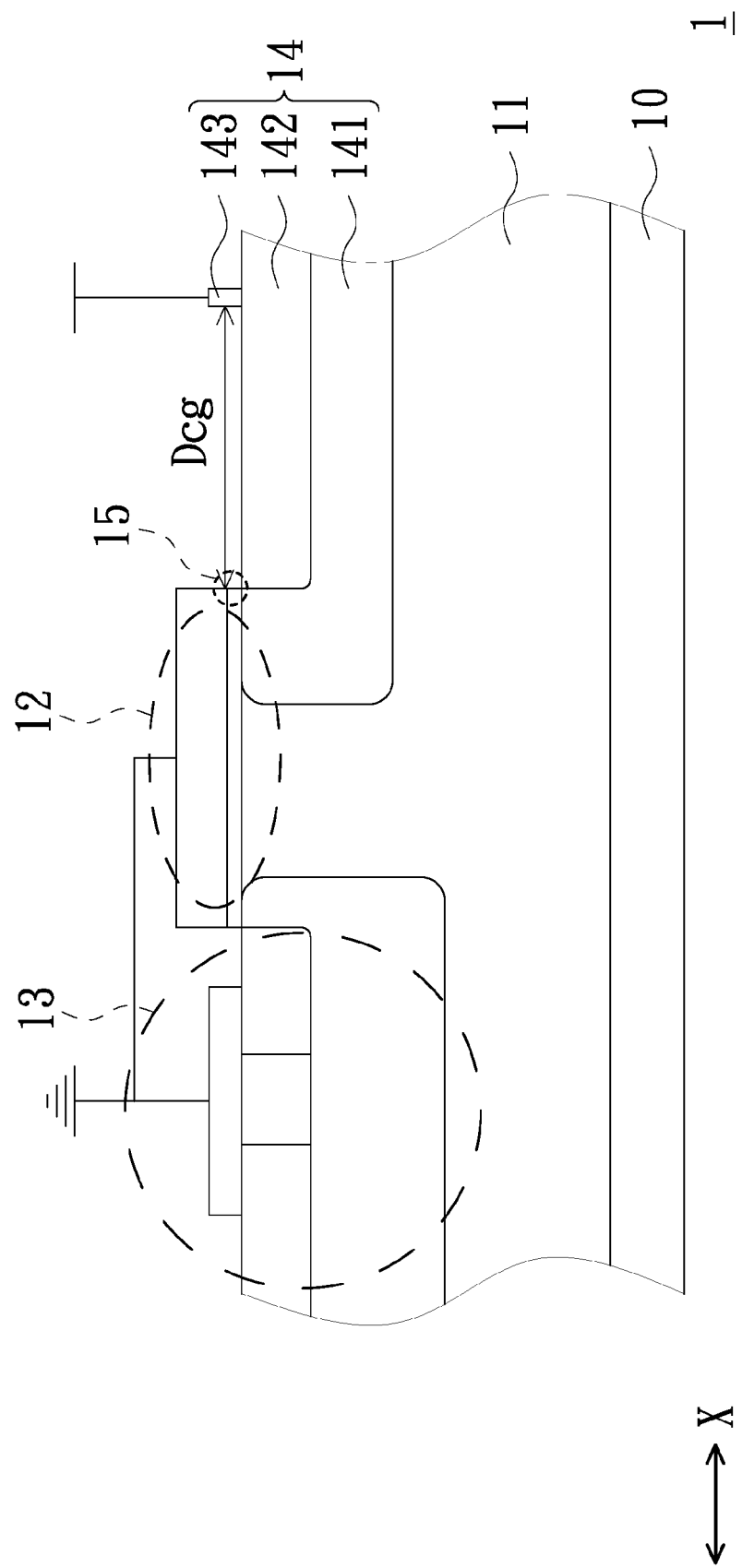
FIG. 2 is a schematic cross sectional view taken along the line A-A' in FIG. 1.

FIG. 1 is a schematic top view showing a lateral diffused N type metal oxide semiconductor device (LDNMOS) 1 for an ESD protecting circuit, and FIG. 2 is a schematic cross sectional view taken along the line A-A' in FIG. 1. The LDNMOS 1 is formed within a region of a substrate 10 that is fully surrounded by a guard ring 19. A deep N well (DNW) 11, a gate structure 12, a source structure 13 and a drain structure 14 are formed in the region. The drain structure 14 includes an N-grade region 141, a high concentration N type (N+) region 142 and a drain electrode 143. The withstanding voltage of the LDNMOS 1 can be improved by increasing a distance Dcg between the drain electrode 143 and the gate structure 12 in the x-axis direction, thereby enabling the ESD protecting circuit to pass various ESD testing such as human body model (HBM) testing or machine model (MM) testing.

However, according to the measuring results, it is found that the withstanding voltage doesn't increase any more or even starts to decrease when Dcg exceeds a certain value due to a strong electric field generated by an intersecting border 15 of the N-grade region 141 and the N+ region 142 too near to the gate structure during the operation of the ESD protecting circuits. As a result, electric leakage occurs in the insulating layer of the gate structure beneath that intersecting border 15. To overcome this shortage, another embodiment is further provided.

Figure 3:
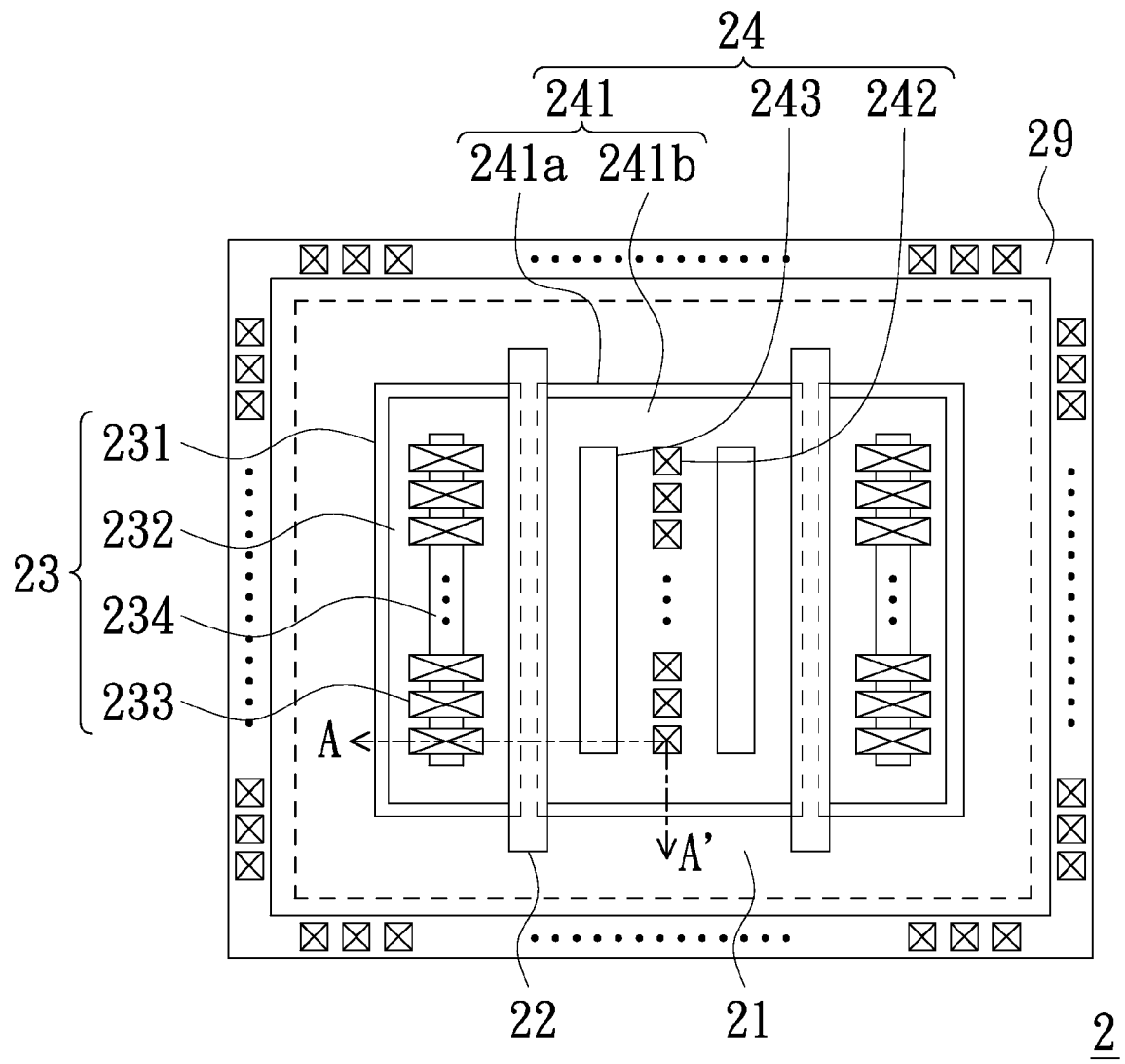
FIG. 3 is a schematic top view showing a semiconductor device in accordance with an embodiment of the present disclosure.
Figure 4:
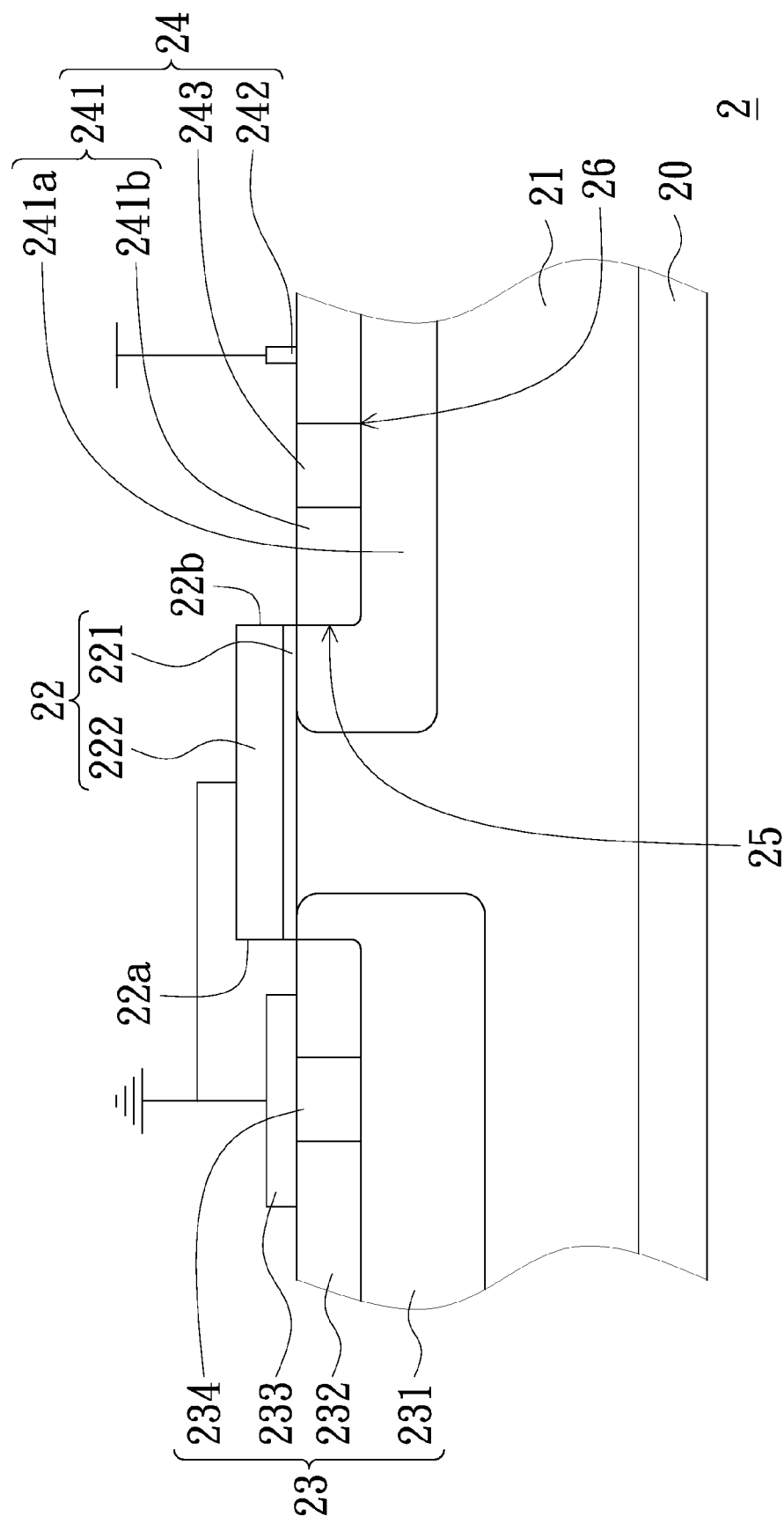
FIG. 4 is a schematic cross sectional view taken along the line A-A' in FIG. 3.

FIG. 3 is a schematic top view showing a semiconductor in accordance with another embodiment, and FIG. 4 is a schematic cross sectional view taken along the line A-A' in FIG. 3. Referring to FIGS. 3 and 4, a semiconductor device 2 of the present embodiment is formed in a region of a substrate 20. The region is fully surrounded by a guard ring 29. A deep well 21, a gate structure 22, a source structure 23 and a drain structure 24 are formed in the region. The gate structure 22 is disposed above the deep well 21, and the source structure 23 is disposed in the deep well 21 and at a first side 22a of the gate structure 22. The drain structure 24 is disposed in the deep well 21 and at an opposite second side 22b of the gate structure 22. The drain structure 24 includes a first doped region 241 of a first conductivity type, a first electrode 242 and a second doped region 243 of a second conductivity type. The first doped region 241 is within the deep well 21 and is electrically connected to the first electrode 242, and the second doped region 243 is disposed within the first doped region 241 and between the first electrode 242 and the gate structure 22. In the present embodiment, the gate structure includes a gate insulating layer 221 and a gate conductor layer 222. The gate insulating layer 221 is interposed between the deep well 21 and the gate conductor layer 222.

The present embodiment is also described taking LDNMOS as an example. The substrate 20, for example, is a silicon substrate; the deep well 21, for example, is a deep N well; the first doped region 241 includes an N-grade region 241a and a first high concentration N type (N+) region 241b. The first N+ region 241b is formed within the N-grade region 241a, and a doping concentration of the first N+ region 241b is greater than that of the N-grade region 241a.

In the present embodiment, there is the second doped region 243 of the second conductivity type; for example, a first high concentration P type region formed by doping with P typed dopants such as boron, configured in the first N+ region 241b. The second doped region 243 is mainly used to prevent that strongest point of the electric field is generated at a first intersecting border 25 of the N-grade region 241a and the first N+ region 241b, and shift the strongest point of the electric field to a second intersecting border 26 of the first N+ region 241b and the second doped region 243. Thus, the strongest point of the electric field is shifted away from the gate structure 22, which is very easily damaged by the electric field. Therefore, the present embodiment would improve the maximum withstanding voltage of ESD protecting circuits.

In the present embodiment, the source structure 23 may include a P type substrate region 231, a second N+ region 232, a second electrode 233 and a second high concentration P type (P+) region 234. The P type substrate region 231 is formed in the deep well 21, and the second N+ region 232 is formed within the P type substrate region 231 and mainly acts as a source contact area. The second electrode 233 is electrically connected to the second N+ region 232. The second P+ region 234 is formed within the second N+ region 232 and mainly acts as a body contact area. In addition, the first electrode 242 of the present embodiment is electrically connected to an anode for providing working voltage; and the second electrode 233 is electrically connected to a cathode for proving a grounding voltage. When ESD occurs, the semiconductor device 2 of the present embodiment establishes a current path between the anode and the cathode to conduct the electrostatic current.

It is to be noted that the second doped region 243 (i.e., the first P+ region) in the drain structure 24 and the second P+ region 234 in the source structure 23 can be simultaneously formed in one single doping process with a same photomask. Therefore, the second doped region 243 and the second P+ region 234 may have a same dose and a same doping depth. There is no need to introduce any additional photomasks. Thus, the semiconductor device of the present embodiment can be manufactured with less number of photomasks.

Besides, the second doped region 243 may be rectangular or in other shape. The only requirement of the second doped region 243 is to form isolation between the first electrode 242 and the gate structure 22 thereby shifting the strongest point of the electric field away from the gate structure 22. Thus, the second doped region 243 of any other shape also improves the maximum withstanding voltage.

Figure 5:
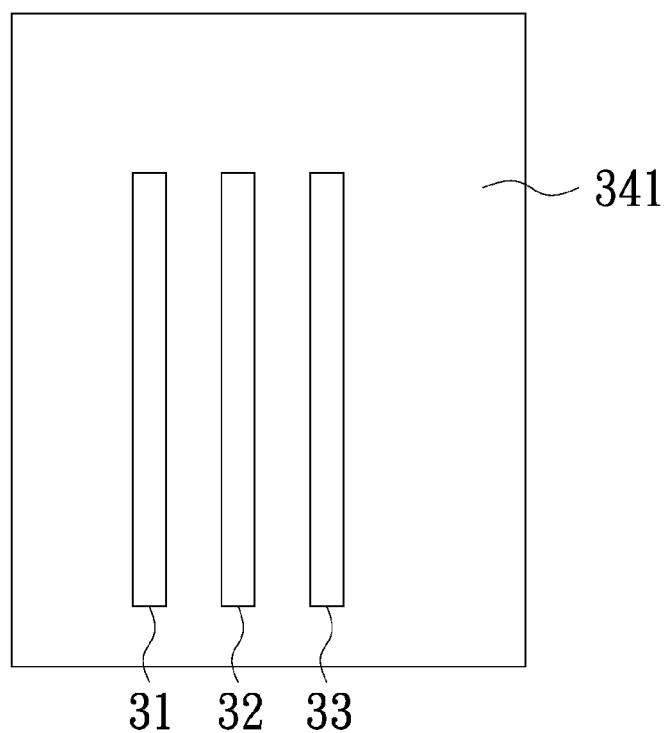
FIG. 5 is a schematic top view showing another implementation of a second doped region.
Figure 6:
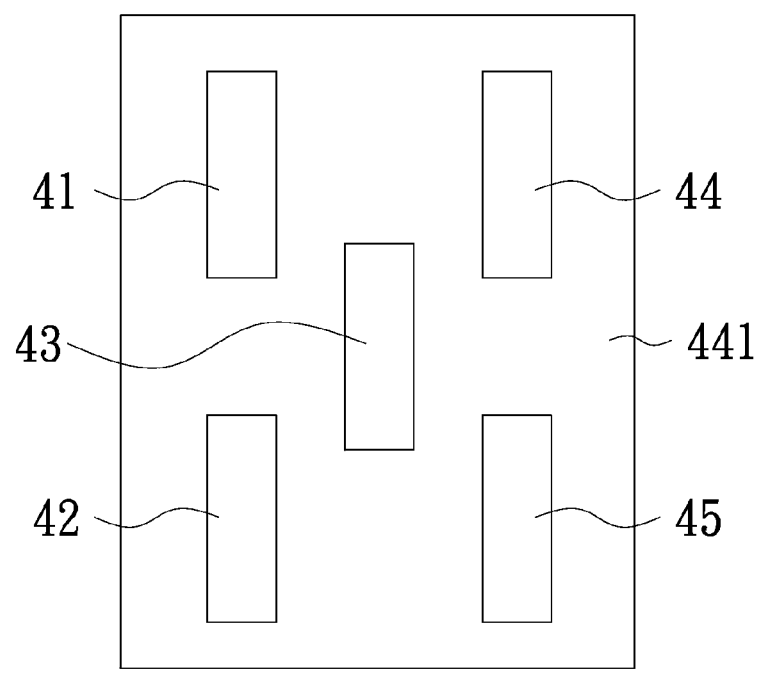
FIG. 6 is a schematic top view showing still another implementation of the second doped region.
Figure 7:
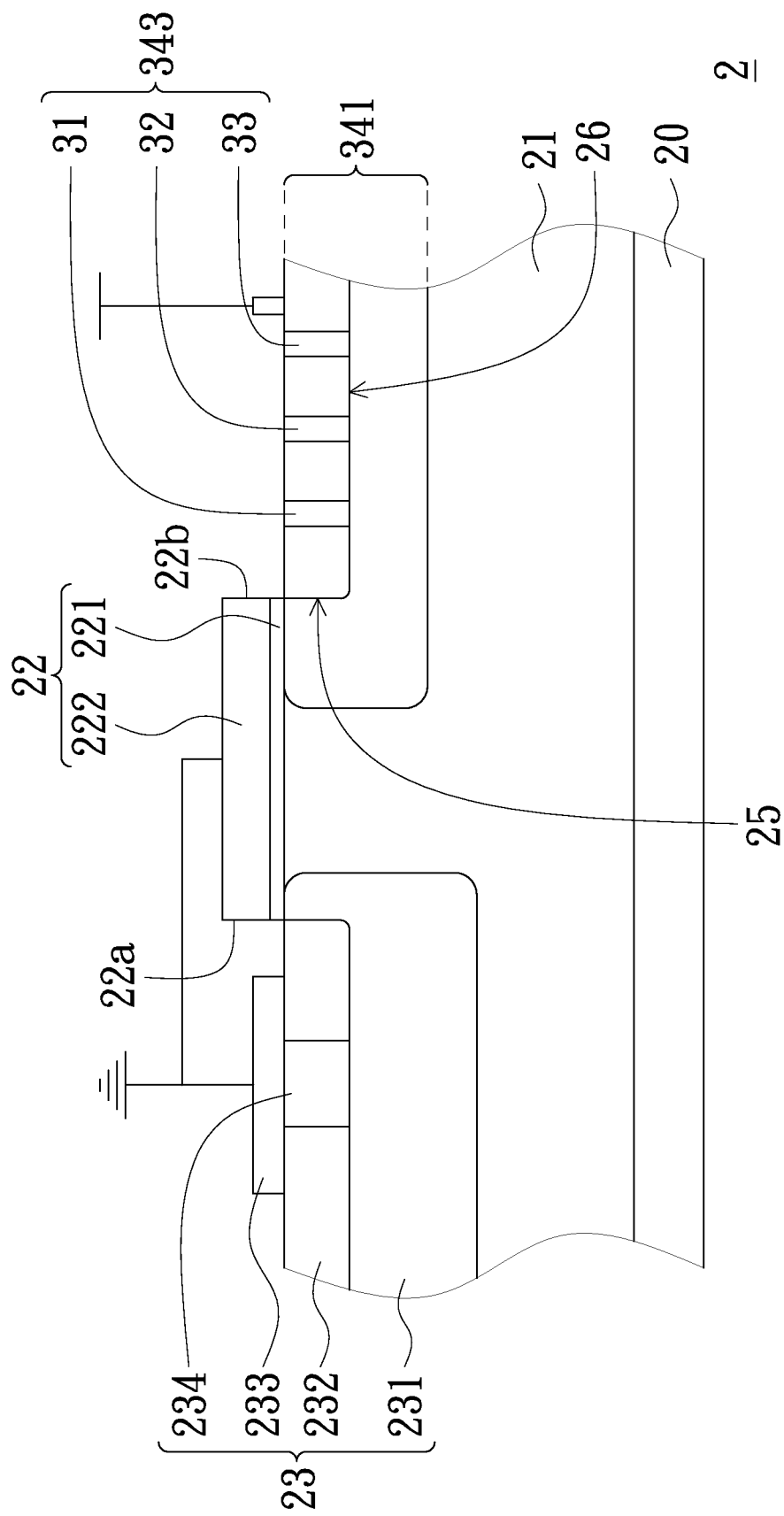
FIG. 7 is a schematic cross sectional view of another implementation of the second doped region in a semiconductor device.

FIG. 5 shows a schematic top view of another implementation of the second doped region. FIG. 7 shows a schematic cross sectional view of another implementation of the second doped region in a semiconductor device. As shown in FIG. 5 and FIG. 7, a second doped region 343, which is disposed between the first electrode 242 and the gate structure 22 (FIGS. 3 and 4), includes three P+ sub-regions 31, 32, 33. The three P+ sub-regions 31, 32, 33 are separated from each other. In FIG. 5, the P+ sub-regions 31, 32, 33 are rectangular, however the shape of the P+ sub-regions 31, 32, 33 are not limited. Besides, the P+ sub-regions 31, 32, 33 are arranged in parallel within a first N+ region 341. The three P+ sub-regions 31, 32, 33 are separated from each other and don't intersects with each other. Thus, even one or two of the three P+ sub-regions are invalid, the remaining ones would also achieve the isolating function. In addition, the arrangement of the P+ sub-regions can also be varied. For example, as shown in FIG. 6, the second doped region of this implementation includes five isolated P+ sub-regions 41, 42, 43, 44 and 45. The five P+ sub-regions are arranged within a first N+ region 441 in a staggered manner. These five P+ sub-regions also achieve the isolating function. According to above embodiments, it is understood that the number of the P+ sub-regions is not limited; and in other words, any number of the P+ sub-regions would achieve the isolating function.

In addition, the semiconductor device is not limited to be N type metal oxide semiconductor device, and can also be P type metal oxide semiconductor device. This is well known for those ordinarily skilled in the art and is not describe in detail for concise consideration.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device, comprising:
a substrate, having a deep well;
a gate structure, disposed above the deep well;
a source structure, disposed in the deep well, and located at a first side of the gate structure; and
a drain structure, disposed in the deep well, and located at a second side of the gate structure, wherein the drain structure comprises:
a first doped region of a first conductivity type, disposed in the deep well;
a first electrode, electrically connected to the first doped region; and
a second doped region of a second conductivity type, disposed in the first doped region and between the first electrode and the gate structure, wherein the deep well is a deep N type well, the first doped region comprises an N-grade region and a first N+ region, the first N+ regions is disposed in the N-grade region, the second doped region is a first P+ region comprising a plurality of isolated P+ sub-regions arranged in the first N+ region.

2. The semiconductor device of claim 1, wherein the substrate is a silicon substrate.

3. The semiconductor device of claim 1, wherein the source structure comprises:
a P type substrate region, located in the deep well;
a second N+ region, disposed in the P type substrate region;
a second electrode, electrically connected to the second N+ region; and
a second P+ region, disposed in the second N+ region.

4. The semiconductor device of claim 3, wherein the first electrode is electrically connected to an anode for proving a working voltage, and the second electrode is electrically connected to a cathode for proving a grounding voltage.

5. The semiconductor device of claim 3, wherein the first P+ region and the second P+ region have same dose and doping depth.

6. The semiconductor device of claim 1, wherein the gate structure comprises a gate insulating layer and a gate conductor layer, and the gate insulating layer is interposed between the gate conductor layer and the deep well.

7. The semiconductor device of claim 1, wherein the semiconductor device is formed in an ESD protecting circuit.

8. The semiconductor device of claim 1, further comprising a guard ring disposed at a peripheral portion of the semiconductor device.

9. The semiconductor device of claim 1, wherein the first conductivity type is different with the second conductivity type.

* * * * *